(12) United States Patent
Mohanty (10) Patent No.: US 8,947,171 B1
(45) Date of Patent: Feb. 3, 2015

(54) COUPLED TIMING OSCILLATORS

(71) Applicant: Sand 9, Inc., Cambridge, MA (US)

(72) Inventor: Pritiraj Mohanty, Los Angeles, CA (US)

(73) Assignee: Sand 9, Inc., Cambridge, MA (US)

( * ) Notice: Subject to any disclaimer, the term of this patent is extended or adjusted under 35 U.S.C. 154(b) by 36 days.

(21) Appl. No.: 13/660,623

(22) Filed: Oct. 25, 2012

Related U.S. Application Data (60) Provisional application No. 61/551,008, filed on Oct. 25, 2011.

(51) Int. Cl.
*H03L 1/02* (2006.01)
*H03K 3/40* (2006.01)

(52) U.S. Cl.
CPC ........................................ *H03K 3/40* (2013.01)
USPC ........................................ 331/116 M; 331/55

(58) Field of Classification Search
USPC ........................... 331/55, 56, 176, 154, 116 M
See application file for complete search history.

(56) References Cited

U.S. PATENT DOCUMENTS

| | | | | |
|---|---|---|---|---|
| 3,766,496 | A | * | 10/1973 | Whitehouse .............. 331/107 A |
| 7,230,501 | B2 | * | 6/2007 | Ogiso ....................... 331/107 A |
| 7,642,871 | B2 | * | 1/2010 | Yajima ...................... 331/107 A |
| 2005/0265053 | A1 | * | 12/2005 | Higashi et al. ................. 363/71 |
| 2010/0314969 | A1 | | 12/2010 | Bahreyni et al. |

OTHER PUBLICATIONS

Shim et al., "Synchronized Oscillation in Coupled Nanomechanical Oscillators," *Science* 316:95-99 (2007).

* cited by examiner

*Primary Examiner* — Joseph Chang
(74) *Attorney, Agent, or Firm* — Wolf, Greenfield & Sacks, P.C.

(57) ABSTRACT

Coupled timing oscillators are described. The coupling may be electrical, mechanical, or electromechanical in some instances. In some cases, the timing oscillators include mechanical resonators. Any number of timing oscillators may be coupled. The coupled timing oscillators may be operated cooperatively to produce an oscillating signal with improved signal characteristics, such as phase noise and jitter.

17 Claims, 5 Drawing Sheets

COUPLED TIMING OSCILLATORS

RELATED APPLICATIONS

This Application claims the benefit under 35 U.S.C. §119 (e) of U.S. Provisional Application Ser. No. 61/551,008, entitled "COUPLED TIMING OSCILLATORS" filed on Oct. 25, 2011, which is herein incorporated by reference in its entirety.

BACKGROUND

1. Field

The technology described herein relates to coupled timing oscillators.

2. Related Art

Some oscillators are used to generate oscillating signals which can serve as reference signals. Some such oscillators include a mechanical resonator that resonates in response to receipt of a drive signal.

BRIEF SUMMARY

According to an aspect of the present application, a device is provided comprising a first timing oscillator configured to receive a first drive signal and output a first oscillating signal, and a second timing oscillator configured to receive a second drive signal and output a second oscillating signal. An output terminal of the first timing oscillator is coupled to an input terminal of the second timing oscillator and an output terminal of the second timing oscillator is coupled to an input terminal of the first timing oscillator.

According to an aspect of the present application, a device is provided comprising a first timing oscillator configured to receive a first drive signal and output a first oscillating signal, the first timing oscillator including a first mechanical resonator. The device further comprises a second timing oscillator configured to receive a second drive signal and output a second oscillating signal, the second timing oscillator including a second mechanical resonator. The first and second mechanical resonators may be coupled to each other.

According to an aspect of the present application, a method is provided comprising producing an oscillating reference signal from two or more coupled timing oscillators.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION OF INVENTION

Conventional timing oscillators, which are one example of self-sustaining oscillators, produce oscillating signals that can exhibit undesirable characteristics, such as large phase noise, jitter, and thermal instability, among others. Phase noise and jitter, as examples, can have a severely negative impact on the performance and value of an oscillator. For instance, phase noise and/or jitter can render a timing oscillator practically useless for purposes of providing an accurate reference signal. Moreover, an oscillator can include multiple sources of phase noise and jitter, and the relative contribution of each source can vary depending on the manner of operation of the oscillators. For oscillators including mechanical resonators, both the mechanical resonator and the oscillator circuitry can contribute to electrical noise (of which phase noise and jitter are examples), with the relative contribution of noise from the circuitry being greater for higher frequencies of operation of the oscillator. Thus, oscillators experience noise which the underlying resonators themselves do not experience.

In some embodiments, it may be desirable to produce an oscillating signal exhibiting low electrical noise, such as low phase noise and jitter, and good thermal stability, as examples. Such signals may be used to provide accurate timing references, or for other purposes. Accordingly, some aspects of the technology described herein include a method of using two or more coupled self-sustaining oscillators to produce a reference frequency signal that is superior in phase noise characteristics. Related structures are also described.

According to an aspect of the present application, two or more self-sustaining timing oscillators may be coupled together, for example to provide an output frequency with superior phase noise performance. In the case of two or more coupled oscillators, the oscillators may be coupled electrically, or the corresponding (mechanical or electrical) resonators may be coupled electrically, mechanically (in the case of mechanical resonators), electromechanically or by other means. In some embodiments, a system comprising multiple coupled oscillators may have multiple output states, where a specific output state with reduced phase noise can be chosen.

The aspects described above, as well as additional aspects, are described further below. These aspects may be used individually, all together, or in any combination of two or more, as the technology is not limited in this respect.

Figure 1:
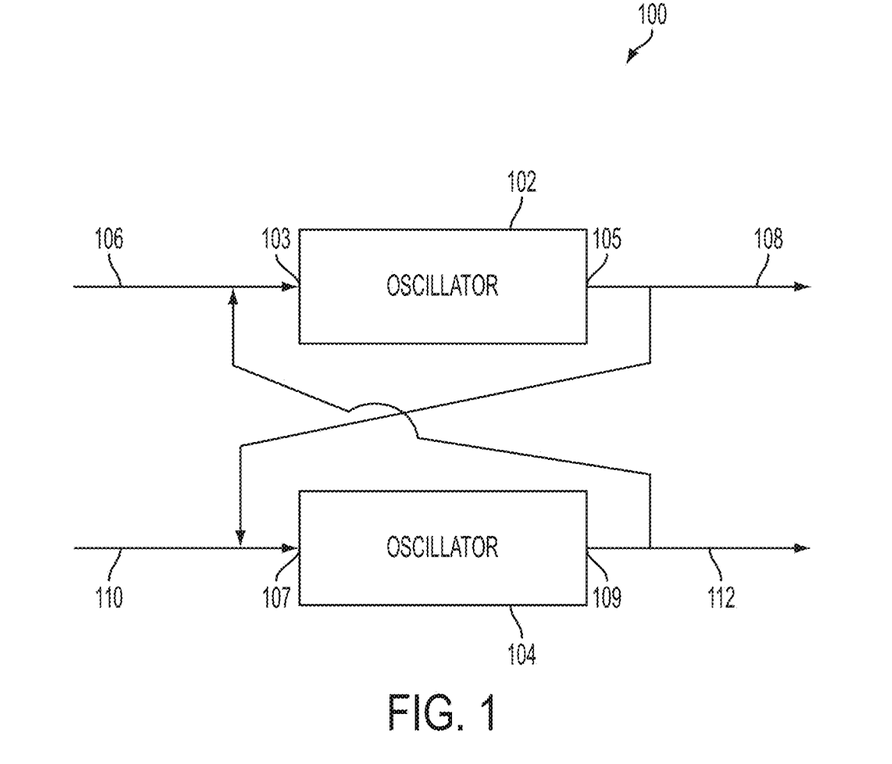
FIG. 1 illustrates two coupled timing oscillators, according to a non-limiting embodiment of the present application.

FIG. 1 illustrates two coupled timing oscillators, according to a non-limiting embodiment of the present application. As shown, the device 100 includes a first oscillator 102 and a second oscillator 104. The first oscillator is configured to receive an input signal (e.g., a drive signal) 106 at an input terminal 103 and produce an output signal (e.g., an oscillating output signal which can be used as a reference signal or for other suitable purposes) 108 at an output terminal 105. The second oscillator 104 is configured to receive an input signal 110 at an input terminal 107 and produce an output signal 112 at an output terminal 109.

As shown, the oscillators 102 and 104 may be coupled. For example, the output signal 108 from oscillator 102 may be fed back to the input signal 110 of oscillator 104 (e.g., by combining the input signal 110 and the output signal 108 in any suitable manner). Similarly, the output signal 112 of oscillator 104 may be fed back to the input signal 106 of oscillator 102 (e.g., by combining the input signal 106 and output signal 112 in any suitable manner). Such cross-coupling may impact the output signals 108 and 112, for example by improving characteristics of one or both of the signals, such as phase noise, jitter, and thermal stability.

Coupling of oscillators may result in synchronization of the oscillators. In some embodiments, the oscillators may self-synchronize. In the synchronized states, when the oscillators are phase-locked, phase noise can be very different from that of the individual oscillators, and in at least some synchronized states, phase noise can be much smaller. Depending on the phase coupling, phase noise of the network can be smaller than that of an individual oscillator at least by a factor $n^2$, where n is the number of oscillators in the network. Such behavior may be realized in portions of the frequency spectrum where phase noises from individual oscillators are not correlated. Thus, according to some embodiments, coupled oscillators may be operated to produce one or more output signals having a frequency at which phase noise from the constituent oscillators is not correlated. In this manner, for example, an output oscillating signal from one or more of the oscillators may be produced exhibiting reduced noise (e.g., reduced phase noise) compared to the noise level achievable with the constituent oscillators. Also, the thermal stability of the signals may be improved, which may be important in various timing applications.

In some embodiments, coupling together self-sustaining oscillators may be particularly beneficial at reducing close-in phase noise. Thus, in some embodiments, two or more self-sustaining oscillators may be configured in combination (e.g., via suitable coupling) to provide an oscillating output signal exhibiting very low close-in phase noise.

In those embodiments in which coupled oscillators are used to produce multiple output oscillating signals (e.g., one output oscillating signal per oscillator), selection of which output signal to use (e.g., as the output signal of the group of oscillators) may be based on which oscillating output signal exhibits desirable signal characteristics, such as low phase noise and/or low jitter. The selection may be performed in any suitable manner (e.g., via a multiplexer or any other suitable circuitry).

Although FIG. 1 illustrates the coupling of two oscillators, it should be appreciated that the aspects described herein relating to coupled oscillators are not limited to the specific number of coupled oscillators unless otherwise stated. Thus, it should be appreciated that the general configuration of FIG. 1 may be expanded to include three or more coupled oscillators. When three or more oscillators are coupled, the coupling may involve cross-coupling each oscillator, though not all embodiments are limited in this respect.

Figure 2:
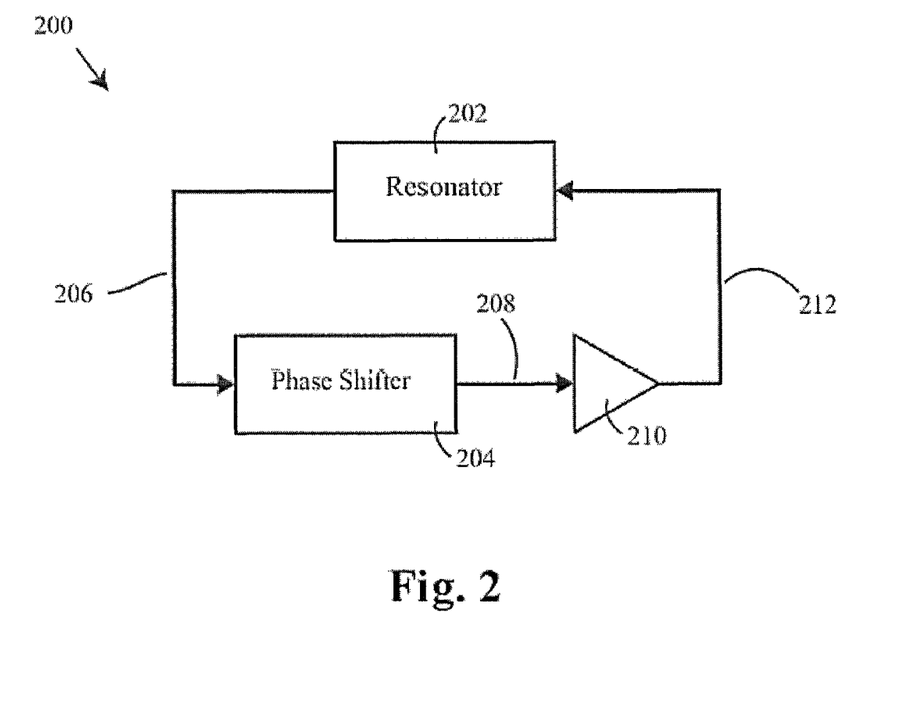
FIG. 2 provides a non-limiting example of a more detailed illustration of a timing oscillator of the type that may be used in the configuration of FIG. 1.

Aspects of the present application involving coupled oscillators may utilize any suitable oscillators. Thus, oscillators 102 and 104 may be any suitable oscillators. A non-limiting example of a suitable timing oscillator configuration is shown in FIG. 2.

As shown, the timing oscillator 200 comprises a mechanical resonator 202, a phase shifter 204, and an amplifier 210 configured in a feedback loop.

The mechanical resonator 202 may be any type of mechanical resonator, such as a microelectromechanical system (MEMS), a nanoelectromechanical system (NEMS), a bulk acoustic wave (BAW) resonator, a surface acoustic wave (SAW) resonator, a film bulk acoustic resonator (FBAR), or any other suitable resonator, as the various aspects described herein are not limited in this respect. In some embodiments, the mechanical resonator 202 may instead be an electrical resonator (e.g., an LC subcircuit).

Similarly, the phase shifter 204 may be any suitable type of phase shifter for receiving an input signal and producing an output signal having a phase shifted relative to that of the input signal. It should be appreciated that phase shifter 204 may be a variable phase shifter according to some embodiments, such that the amount of phase shift provided by the phase shifter 204 may be varied.

With respect to FIG. 2, the mechanical resonator 202 may produce an output signal 206, having a phase, which output signal may be input to the phase shifter 204. The phase shifter 204, upon receiving the output signal 206 of the mechanical resonator 202, may shift the phase of the output signal 206 and produce a phase-shifted output signal 208. The phase-shifted output signal 208 may be identical to the resonator output signal 206, except for having a different phase. However, the various aspects described herein are not limited in this respect.

According to some embodiments, a gain factor is applied in the feedback loop of device 200. In the non-limiting example of FIG. 2, an amplifier 210 is included to provide gain, and may have any suitable gain factor. The amplifier 210 receives the phase-shifted output signal 208, and produces an amplified output signal 212, which is then provided to an input of the mechanical resonator 202. Thus, in some embodiments, the signal provided to the input of the mechanical resonator 202 may differ from the output of the mechanical resonator in both phase and magnitude, although not all embodiments are limited in this respect.

It should be appreciated that the inclusion and configuration of amplifier 210 for providing gain is subject to variation, and may not be included in all embodiments. For example, a gain stage could alternatively be provided in front of the phase shifter 204 (as opposed to behind the phase shifter 204), to operate directly on the output signal of the mechanical resonator 202. Alternatively, a gain stage may be implemented as part of the phase shifter 204, rather than as a distinct element. Other configurations are also possible, and the various aspects described herein are not limited to using any particular type or configuration of gain element.

In operation, if the total amount of phase shift provided by the phase shifter 204 is greater than, for example, 180 degrees, the timing oscillator 200 may exhibit resonance at a frequency greater than the series resonance frequency of the mechanical resonator 202. If the total amount of phase shift provided by the phase shifter 204 is less than, for example, 180 degrees, the device 200 may exhibit resonance at a frequency lower than the series resonance frequency of the mechanical resonator 202. Thus, by varying the amount of phase shift provided by the phase shifter 204, the device 200 may be tuned on both sides of the series resonance peak of the mechanical resonator 202.

As mentioned, the resonator 202 may be any suitable type of resonator, including a mechanical resonator or an electrical resonator. More generally, the aspects described herein relating to coupled timing oscillators are not limited to the type of resonator implemented in the oscillators. A non-limiting example of a suitable mechanical resonator is illustrated in FIGS. 3A and 3B, which represent a perspective view and cross-sectional view, respectively.

Figure 3A:
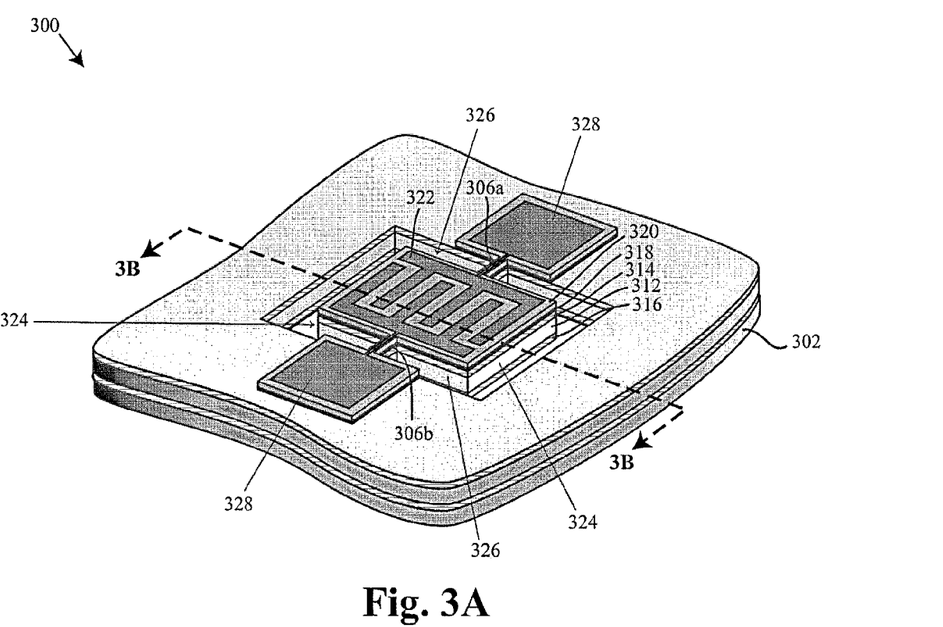
FIGS. 3A and 3B illustrate a perspective view and cross-sectional view, respectively, of a non-limiting example of a mechanical resonator of the type that may be used in a timing oscillator, according to a non-limiting embodiment of the present application.
Figure 3B:
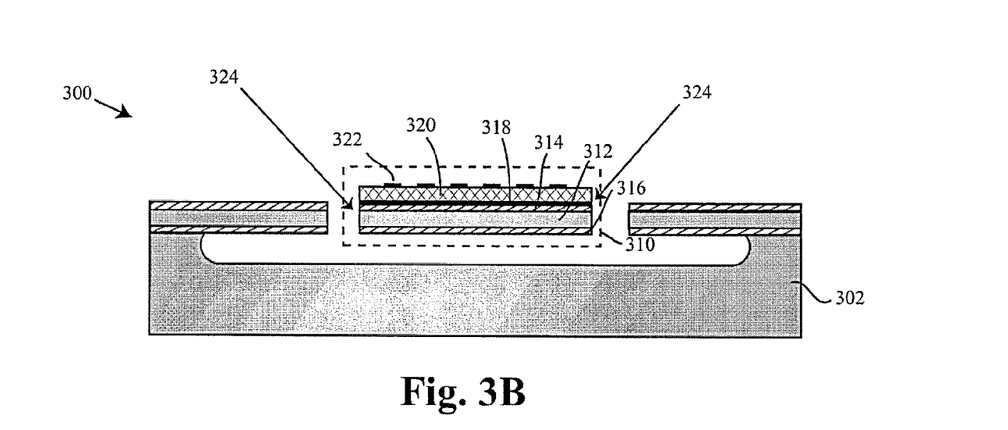

A non-limiting example of a mechanical resonating structure to which aspects of the present application may apply is illustrated in FIGS. 3A and 3B and now described. However, it should be appreciated that the various aspects are not limited to the type of mechanical resonating structures shown herein, but rather that other types of mechanical resonating structures having semiconductor materials may be used.

FIGS. 3A and 3B provide a perspective view and a more detailed cross-sectional view, respectively, of a device 300 including a micromechanical resonating structure 310 (reference number shown in FIG. 3B). As illustrated, the micromechanical resonating structure 310 may include an active layer 320 (e.g., a piezoelectric layer, for example made of aluminum nitride, or any other suitable piezoelectric material), a conducting layer 318 (e.g., a metal electrode), and one or more electrodes 322 (which may, in some embodiments be configured as top electrodes). A contact pad 328 may provide electrical access to the electrodes 322. The conducting layer 318 may, in some embodiments, be configured as an electrode, and may therefore in some embodiments be considered a bottom electrode. Electrical access to the conducting layer may be provided by a portion of the conducting layer located below the contact pad 328. For example, the portion of the conducting layer located below the contact pad 328 may be made larger than the contact pad 328, allowing for separate electrical contact to be made to the contact pad 328 and the portion of the conducting layer 318 located below the contact pad. Alternatively, a separate contact pad (e.g., next to contact pad 328 or in any other suitable location), may provide electrical access to the conducting layer 318. Other alternatives are also possible. The active layer 320 may be actuated by applying a voltage/electric field thereto using electrodes 322 (formed, for example, of a metal) and bottom conducting layer 318, which in some embodiments may be configured as a ground plane. Not all the illustrated components are required and other components may be included in some embodiments, as the illustration provides a non-limiting example of a mechanical resonating structure.

The micromechanical resonating structure 310 also includes a silicon layer 312, a silicon oxide layer 314 on the top surface of the silicon layer 312, and a silicon oxide layer 316 on the bottom surface of the silicon layer 312. The combination of silicon layer 312 and silicon oxide layers 314 and 316 may operate as a temperature compensation structure (a temperature compensation stack in this configuration) to compensate temperature-induced changes in the frequency of operation of micromechanical resonating structure 310, as described further below. It should be appreciated that the silicon layer 312 may be formed of any suitable semiconductor material, and that silicon is a non-limiting example described herein for purposes of illustration. Non-limiting alternatives include germanium, gallium arsenide, or other semiconductor materials. Thus, the use of silicon for layer 312 is not limiting. Similarly, layers 314 and 316 may be formed of any suitable material (e.g., other types of oxide than silicon oxide), as silicon oxide is a non-limiting example described herein for purposes of illustration. Also, as mentioned, not all the illustrated components are required and other components may be included in some embodiments, as the illustration provides a non-limiting example of a mechanical resonating structure.

The micromechanical resonating structure may be connected to a substrate 302 by two or more anchors. As shown in FIG. 3A, the micromechanical resonating structure 310 is connected to the substrate 302 by two anchors, 306a and 306b, which may be flexible in some embodiments. The number of anchors is not limiting, as any suitable number may be used. It should further be understood that the geometry of the anchors may be matched to a specific length to reduce the amount of acoustic energy transferred from the micromechanical resonating structure to the substrate. Suitable anchor structures that reduce stress and inhibit energy loss have been described in U.S. patent application Ser. No. 12/732,575, filed Mar. 26, 2010, published as U.S. Patent Publication No. 2010/0314969 and entitled "Mechanical Resonating Structures and Methods", which is hereby incorporated herein by reference in its entirety.

As mentioned, various types and forms of mechanical resonating structures may be used with the aspects of the present application, and FIGS. 3A and 3B provide only a non-limiting example. For example, the mechanical resonating structure may comprise or be formed of any suitable material(s) and may have any composition. According to some embodiments, the mechanical resonating structure may comprise a piezoelectric material (e.g., active layer 320). According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), CVD diamond, SiGe, Si, superconducting materials, and heterostructures of all kinds (piezoelectric/semiconductor, semiconductor/metal, bimetal, etc.), either in substantially pure form or in combination with one or more other materials. Moreover, in some embodiments in which the mechanical resonating structure comprises a piezoelectric material, the piezoelectric material may be single crystal material, although in other embodiments including a piezoelectric material the piezoelectric material may be polycrystalline.

The mechanical resonating structure may have any shape, as the shape illustrated in FIGS. 3A and 3B is a non-limiting example. For example, aspects of the technology may apply to mechanical resonating structures that are substantially rectangular, substantially ring-shaped, substantially disc-shaped, or that have any other suitable shape. As additional, non-limiting examples, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Moreover, the mechanical resonating structure may have one or more beveled edges. According to some embodiments, the mechanical resonating structure may be substantially planar. Moreover, geometrical and structural alterations can be made to improve quality (e.g., Q-factor, noise) of a signal generated by the mechanical resonating structure.

The mechanical resonating structures described herein may have any suitable dimensions, and in some embodiments may be micromechanical resonating structures. A mechanical resonating structure may have any suitable thickness, T, and in some embodiments the thickness may be related to a wavelength of a desired oscillation mode. According to a non-limiting embodiment, the thickness T may be less than $2\lambda$, less than $\lambda$, less than $\frac{1}{2}\lambda$, less than $\frac{1}{4}\lambda$, less than $\frac{1}{6}\lambda$, or any other suitable value, where $\lambda$ is a wavelength of operation of the mechanical resonating structure (e.g., a wavelength of a resonance mode of interest of a mechanical resonating structure, an acoustic wavelength of a Lamb wave of interest, etc.). According to a non-limiting embodiment, the mechanical resonating structure may be configured to support Lamb waves, and T may be less than $2\lambda$, less than $\frac{1}{2}\lambda$, or have any other suitable According to some embodiments, the mechanical resonating structures described herein have a large dimension (e.g., the largest of length, width, diameter, circumference, etc. of the mechanical resonating structure) of less than approximately 1000 microns, less than approximately 500 microns, less than approximately 100 microns, less than approximately 50 microns, or any other suitable value. It should be appreciated that other sizes are also possible. According to some embodiments, the devices described herein form part or all of a microelectromechanical system (MEMS).

The mechanical resonating structures may have any desired resonance frequencies and frequencies of operation, and may be configured to provide output signals of any desired frequencies. For example, the resonance frequencies and/or frequencies of operation of the mechanical resonating structures, and the frequencies of the output signals provided by the mechanical resonating structures, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the listed frequencies are not limiting.

The mechanical resonating structures may be operated in various acoustic modes, including but not limited to Lamb waves, also referred to as plate waves including flexural modes, bulk acoustic waves, surface acoustic waves, extensional modes, translational modes and torsional modes. The selected mode may depend on a desired application of the mechanical resonating structure.

The mechanical resonating structure may be actuated and/or detected in any suitable manner, with the particular type of actuation and/or detection depending on the type of mechanical resonating structure, the desired operating characteristics (e.g., desired mode of operation, frequency of operation, etc.), or any other suitable criteria. For example, suitable actuation and/or detection techniques include, but are not limited to, piezoelectric techniques, electrostatic techniques, magnetic techniques (e.g., magnetomotive, magnetostatic), thermal techniques (e.g., thermoelastic, thermomechanical), piezoresistive techniques, and optical techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators. Such Lamb wave devices may operate based on propagating acoustic waves, with the edges of the structure serving as reflectors for the waves. For such devices, the spacing between the edges of the resonating structure may define the resonance cavity, and resonance may be achieved when the cavity is an integer multiple of p, where $p=\lambda/2$, with $\lambda$ being the acoustic wavelength of the Lamb wave of interest, understanding that the device may support more than one mode of Lamb waves. However, it should be appreciated that aspects of the technology described herein apply to other types of structures as well, and that Lamb wave structures are merely non-limiting examples.

As should be appreciated from FIGS. 3A and 3B, in some embodiments suspended mechanical resonating structures are used, meaning that the mechanical resonating structure(s) may have one or more free sides or ends. Referring to FIG. 3A, the micromechanical resonating structure 310 has free ends 324 and the sides 326 are also substantially free, connected to the substrate 302 by anchors 306a and 306b.

Figure 4A:
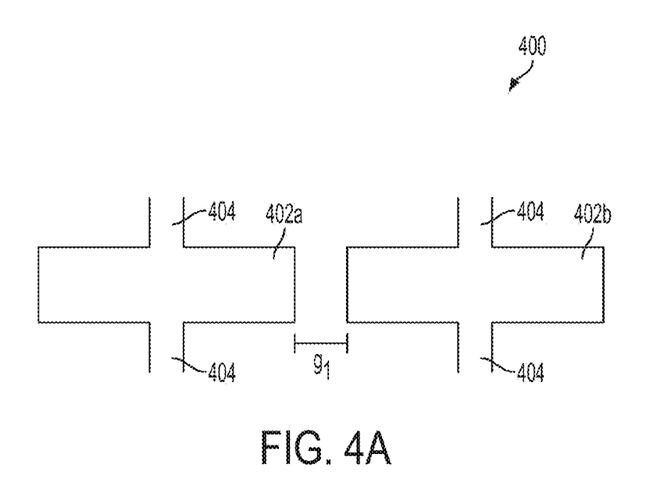
FIGS. 4A and 4B illustrate a top view and cross-sectional view, respectively, of two coupled mechanical resonators, according to a non-limiting embodiment of the present application.
Figure 4B:
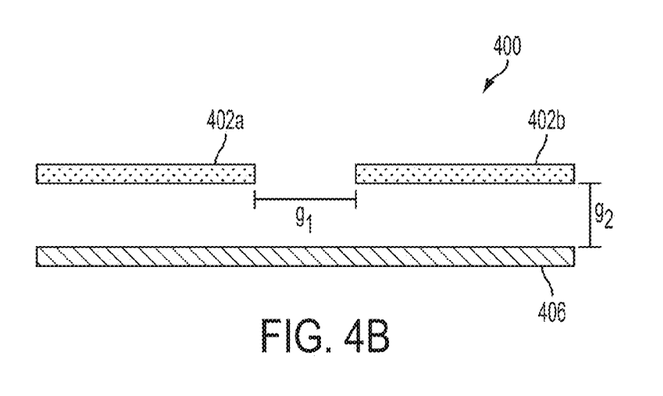

As described previously, in some embodiments coupled oscillators may be coupled by electromechanically coupling the resonators of such oscillators. A non-limiting example is illustrated in FIGS. 4A and 4B, which show a top view and cross-sectional view, respectively, of two coupled mechanical resonators, according to a non-limiting embodiment of the present application.

The device 400 may include first and second mechanical resonators 402a and 402b. As shown in FIG. 4A, each of the mechanical resonators 402a and 402b may be plate acoustic wave resonators including anchors 404 (e.g., for connecting the resonators to a substrate). The mechanical resonators 402a and 402b may be separated from each other by a gap $g_1$, which may have any suitable value. The resonators may also be suspended above a ground plane 406 by a gap $g_2$, as shown in FIG. 4B.

In operation, the mechanical resonators 402a and 402b may be excited to exhibit in-plane vibration, causing the gap $g_1$ to vary with time. The electromechanical coupling may therefore impact the output signals provided by one or both of the mechanical resonators, for example by causing the output signals to exhibit improved signal characteristics, such as improved phase noise and/or jitter. In some embodiments, the resonators 402a and 402b may be capacitively coupled to each other (e.g., the variations in the distance between the resonators may alter a capacitive coupling between the two).

Figure 5:
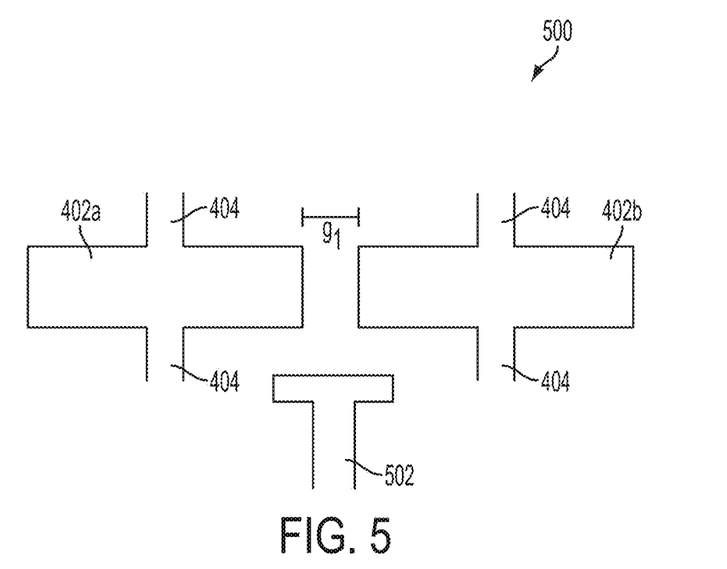
FIG. 5 illustrates a top view of an alternative configuration to that of FIG. 4A in which two mechanical resonators are coupled, according to a non-limiting embodiment of the present application.

FIG. 5 illustrates an alternative configuration to that of FIG. 4. The device 500 includes an electrode 502 (which may be a T-electrode, as shown), which may be configured in-plane with the mechanical resonators 402a and 402b. The electrode 502 may excite one or both of the mechanical resonators 402a and 402b, and may be used to apply a bias signal to the mechanical resonators (e.g., if the mechanical resonators are excited in some manner other than by using electrode 502). Other configurations are also possible.

From the foregoing, it should be appreciated that aspects of the present application provide a timing oscillator comprising two or more (and in some cases, only two) coupled constituent timing oscillators. In some embodiments, one or more (and in some cases, each) of the constituent oscillators includes a mechanical resonator. In some such embodiments, the mechanical resonators may be mechanically coupled and/or electrically coupled and/or electro-mechanically coupled.

In some embodiments, relative phase of the constituent oscillators is locked by external bias, sometimes referred to as "phase locking." By controlling the relative phase of two or more oscillators, characteristics of the output signal of one or more of the oscillators may be beneficially controlled. For example, a particular phase relationship between the output signals of two or more oscillators may correspond to a desirable part of parameter space corresponding to, for example, low phase noise, low jitter, high stability, etc.

The relative phase of two or more oscillators may be controlled in any suitable manner. In some embodiments, the relative phase may be controlled by injecting (or introducing) an external signal (or bias) with a fixed phase into a loop with the phase difference. For instance, assuming two coupled oscillators exhibiting a phase difference $\Delta\phi$, an external signal with a fixed phase $\phi_2$ may be injected into a loop with the phase difference. As a result, the phase difference $\Delta\phi$ may be forced to a value equal to $2n\pi-\phi_2$, where n is an integer (n=0, 1, 2, 3, etc.). In this manner, the phase difference between two or more oscillators may be forced to a desired, predetermined value. Other manners of controlling the phase difference between coupled oscillators are also possible.

In some embodiments, an oscillator of a system comprising multiple coupled oscillators may include a mechanical resonator that is a micro-mechanical resonator with at least one critical dimension (impacting the resonance behavior of the resonator) less than approximately 500 microns in size.

In some embodiments in which an oscillator includes a mechanical resonator, the mechanical resonator is fabricated from materials selected from the group comprising silicon, silicon oxide, aluminum nitride, aluminum oxide, zinc oxide, lithium niobate and quartz.

In some embodiments in which an oscillator includes a mechanical resonators, the mechanical resonator is actuated by piezoelectric, electrostatic, magnetic or other standard techniques. In some embodiment, the resonator is detected by piezoelectric, electrostatic, magnetic or other standard techniques. In some embodiments, the resonator is actuated or detected by a hybrid of techniques.

In some embodiments, the resonator is operated at a frequency in the range of 1 MHz-10 GHz.

In some embodiments involving coupled oscillators, one or more of the oscillators may comprise an electronic resonator. The electronic resonator may be an LC resonator.

According to an aspect of the present application, a timing oscillator is provided comprising two or more (and in some cases, only two) coupled constituent timing oscillators configured to produce at least one output reference frequency. In some embodiments, a single output frequency may be selected from the at least one output reference frequency. The single output reference frequency may be chosen so that the associated phase noise is smaller than the corresponding phase noise of constituent oscillators. In some embodiments, the single output frequency is chosen so that the associated phase noise is smaller than the corresponding phase noise of constituent oscillators in a specific frequency band.

In some embodiments, the single output frequency is chosen so that the associated jitter is smaller than the jitter of constituent oscillators.

In some embodiments, the single output frequency is chosen so that the frequency stability is better than the frequency stability of constituent oscillators.

According to an aspect of the present application, a timing oscillator is provided comprising a network of constituent timing oscillators with at least one output reference frequency with associated phase noise that is less than the phase noise of each of the constituent timing oscillators.

Aspects of the present application may provide one or more benefits, non-limiting examples of which are now described. It should be appreciated that other benefits may also be realized, and that not all embodiments provide all benefits. According to some embodiments, an oscillating signal (e.g., an oscillating reference signal) is produced exhibiting superior phase noise characteristics than is possible from using a single oscillator. In some embodiments, an oscillating signal is produced exhibiting a higher degree of stability than is possible from using a single oscillator.

Aspects of the present application may be used in connection with stand-alone devices or in various larger devices and systems. For example, aspects of the present application may be used in connection with timing oscillators, temperature compensated MEMS oscillators, oven-controlled MEMS oscillators, cellular phones, PDAs, personal computers, RFID tracking devices, GPS receivers, wireless-enabled appliances and peripherals (printers, digital cameras, household appliances), satellite radio receivers (Sirius/XM), military platforms, automobiles, land vehicles, airplanes, drones, blimps, zeppelins, ship and boats, kayaks, range finders, PNDs, laptops, tablet computers, femtocells, implantable location trackers and any location aware device.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

In addition, while some references have been incorporated herein by reference, it should be appreciated that the present application controls to the extent the incorporated references are contrary to what is described herein.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A device, comprising:
a first timing oscillator configured to receive a first drive signal and output from a first microelectromechanical system (MEMS) resonator a first oscillating signal;
a second timing oscillator configured to receive a second drive signal and output from a second MEMS resonator a second oscillating signal,
wherein an output terminal of the first timing oscillator is coupled to an input terminal of the second timing oscillator and wherein an output terminal of the second timing oscillator is coupled to an input terminal of the first timing oscillator.

2. The device of claim 1, wherein the first MEMS resonator comprises an active layer and a multi-layer temperature compensation structure.

3. The device of claim 2, wherein the temperature compensation structure comprises a first layer formed of a first material having a stiffness which increases with increasing temperature over a first operating temperature range and a second layer formed of a second material having a stiffness which decreases with increasing temperature over the first operating temperature range.

4. The device of claim 1, wherein the first and second timing oscillators are configured to self-synchronize.

5. The device of claim 1, wherein the first timing oscillator comprises a piezoelectric mechanical resonator configured to produce the first oscillating signal.

6. The device of claim 1, wherein the first and second output signals have different frequencies from each other, and wherein the first output signal is characterized by lower phase noise than the second output signal.

7. A device, comprising:
a first timing oscillator configured to receive a first drive signal and output a first oscillating signal, the first timing oscillator including a first mechanical resonator;
a second timing oscillator configured to receive a second drive signal and output a second oscillating signal, the second timing oscillator including a second mechanical resonator,
wherein the first and second mechanical resonators are coupled to each other.

8. The device of claim 7, wherein the first mechanical resonator is a suspended, piezoelectric Lamb wave resonator configured to exhibit in-plane vibration in response to being excited by the first drive signal.

9. The device of claim 7, wherein the first and second mechanical resonators are mechanically coupled to each other.

10. The device of claim 7, wherein the first and second mechanical resonators are electrically coupled to each other.

11. The device of claim 7, wherein the first and second mechanical resonators are capacitively coupled to each other.

12. A method, comprising:
    producing an oscillating reference signal from two or more coupled timing oscillators, wherein producing the oscillating reference signal comprises electromechanically coupling a mechanical resonator of a first timing oscillator of the two or more timing oscillators with a mechanical resonator of a second timing oscillator of the two or more timing oscillators.

13. The method of claim 12, wherein producing the oscillating reference signal comprises providing an output signal from the first timing oscillator of the two or more coupled timing oscillators to an input terminal of the second timing oscillator of the two or more coupled timing oscillators, and further providing an output signal from the second timing oscillator to an input terminal of the first timing oscillator.

14. The method of claim 12, further comprising producing a plurality of oscillating reference signals from the two or more coupled timing oscillators including the oscillating reference signal, wherein a first oscillating reference signal of the plurality of oscillating reference signals has a first frequency and wherein a second oscillating reference signal of the plurality of oscillating reference signals has a second frequency different than the first frequency.

15. The method of claim 14, wherein the first oscillating reference signal is characterized by lower phase noise than the second oscillating reference signal.

16. The method of claim 14, wherein the first oscillating reference signal is characterized by lower jitter than the second oscillating reference signal.

17. The method of claim 12, further comprising synchronizing operation of the two or more coupled timing oscillators, and wherein producing the oscillating reference signal from the two or more coupled timing oscillators is performed after synchronizing the operation of the two or more coupled timing oscillators.

* * * * *